United States Patent [19]

Itabashi et al.

[11] Patent Number: 5,308,996
[45] Date of Patent: May 3, 1994

[54] TFT DEVICE

[75] Inventors: Satoshi Itabashi, Atsugi; Masaki Fukaya, Isehara; Toshiyuki Komatsu; Yoshiyuki Osada, both of Atsugi; Ihachiro Gofuku, Hiratsuka, all of Japan

[73] Assignee: Canon Kabushiki Kaisha, Tokyo, Japan

[21] Appl. No.: 82,908

[22] Filed: Jun. 29, 1993

Related U.S. Application Data

[63] Continuation of Ser. No. 727,285, Jul. 5, 1991, abandoned, which is a continuation of Ser. No. 368,886, Jun. 20, 1989, abandoned, which is a continuation of Ser. No. 99,908, Sep. 22, 1987, abandoned.

[30] Foreign Application Priority Data

Sep. 25, 1986 [JP] Japan .................................. 61-227430
Sep. 26, 1986 [JP] Japan .................................. 61-229268

[51] Int. Cl.$^5$ ...................... H01L 31/10; H01L 27/14
[52] U.S. Cl. ........................................ 257/53; 257/291; 257/436; 257/439; 257/463; 257/464; 250/370.14
[58] Field of Search ...................... 357/23.7, 4, 32, 30; 257/58, 291, 436, 439, 443, 463, 464; 250/370.14

[56] References Cited

U.S. PATENT DOCUMENTS

| | | | |
|---|---|---|---|
| 3,289,054 | 11/1966 | Haering | 357/23.7 |
| 4,143,266 | 3/1979 | Borel et al. | 357/23.7 |
| 4,461,956 | 7/1984 | Hatanaka | 357/32 |
| 4,886,962 | 12/1989 | Gofuku et al. | 250/211 J |
| 4,931,661 | 6/1990 | Fukaya et al. | 250/578.1 |

FOREIGN PATENT DOCUMENTS 60-239072 11/1985 Japan .................................. 357/23.7

OTHER PUBLICATIONS

English translation of the pertinent part of the Japanese Laid-Open Gazette No. 60-239072.

Primary Examiner—Jerome Jackson
Attorney, Agent, or Firm—Fitzpatrick, Cella, Harper & Scinto

[57] ABSTRACT

A TFT device has an insulation substrate, a semiconductor layer formed on the insulation substrate, a pair of opposed electrodes formed on the semiconductor layer, and a gate electrode formed on the semiconductor layer with an insulation film interposed therebetween, wherein a region doped with at least one type of impurity selected from atoms belonging to the V group of the periodic table is formed in the semiconductor layer at the vicinity of the interface between the semiconductor layer and the insulation layer.

19 Claims, 11 Drawing Sheets

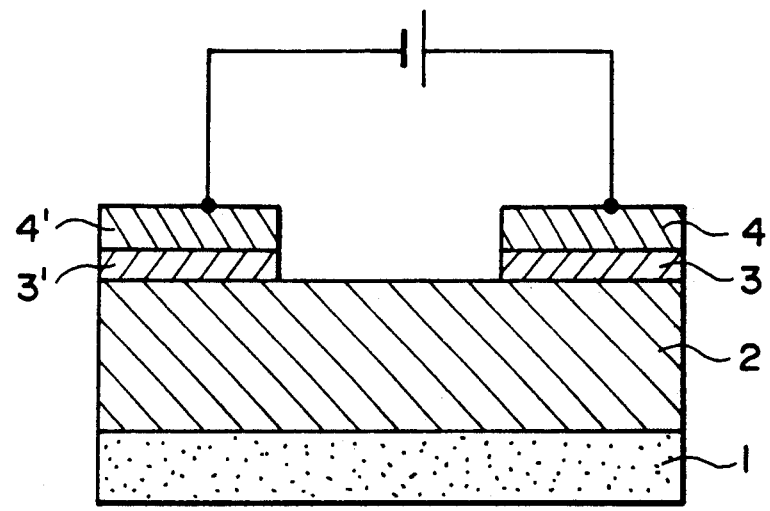
F I G. 1
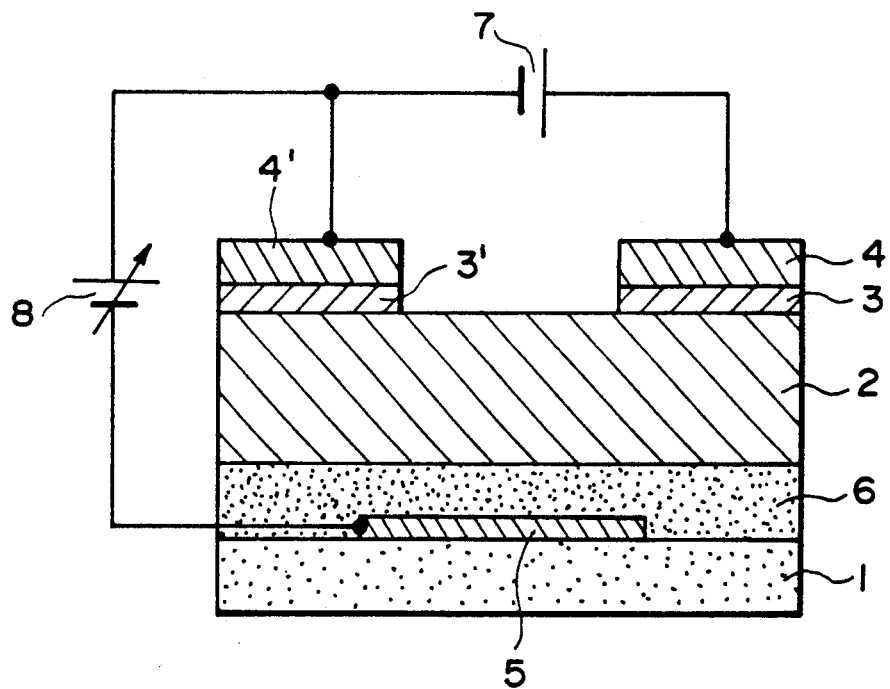
F I G. 2

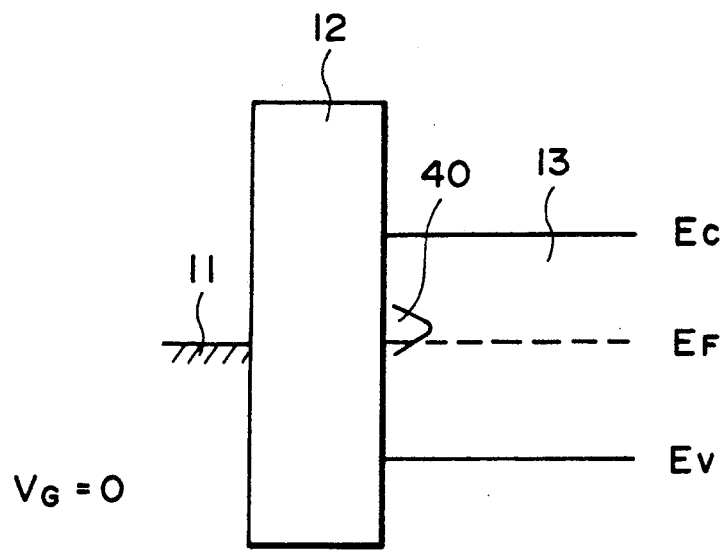
FIG. 3C-A
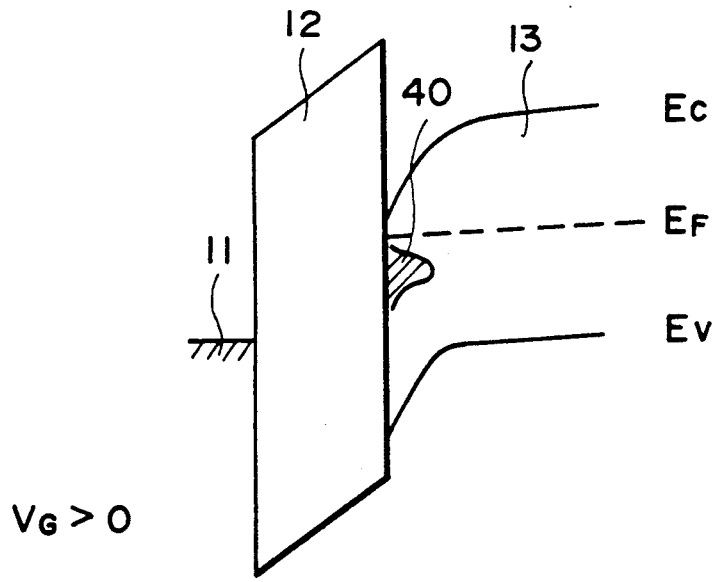
FIG. 3C-B

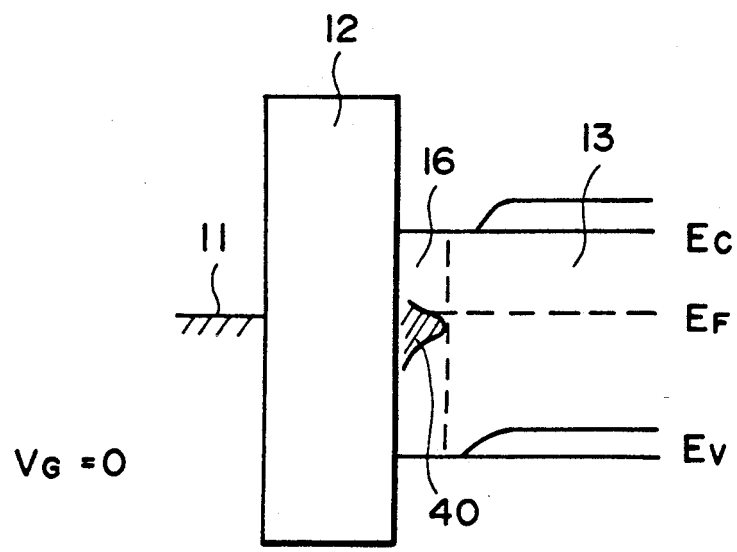
FIG. 3D-A
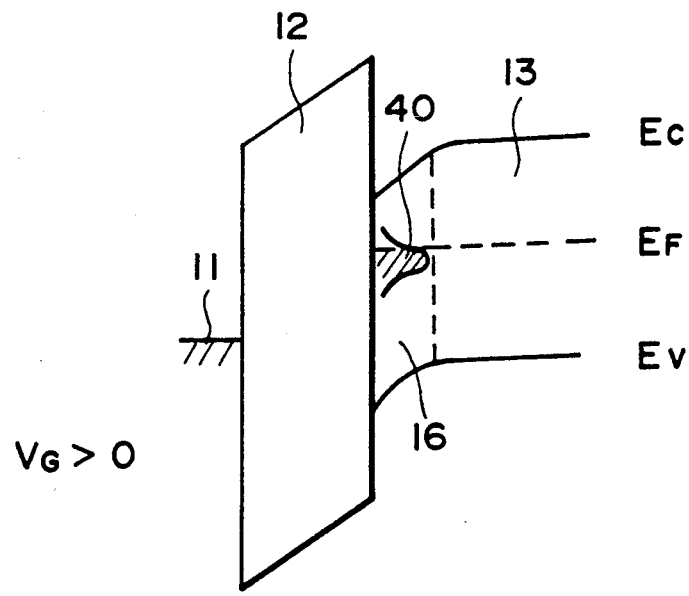
FIG. 3D-B

TFT DEVICE

This application is a continuation of application Ser. No. 07/727,285 filed Jul. 5, 1991, now abandoned; which in turn, is a continuation of application Ser. No. 368,886, filed Jun. 20, 1989, now abandoned; which in turn is a continuation of application Ser. No. 099,908, filed Sep. 22, 1987, now abandoned.

BACKGROUND OF THE INVENTION

1. Field of the Invention

The present invention relates to a TFT device, particularly to a TFT device of a photoelectric converter suitable for use as a photosensor and/or a driver for driving the photosensor.

2. Related Background Art

Photosensors have been used heretofore as a photoelectric converter of an image information processing apparatus such as facsimile apparatus, digital copying machines and image readers.

Specifically, amorphous silicon hydride (hereinafter denominated a-Si:H) thin film transistors have been used recently as photosensors of a high sensitivity image reader which is constructed of elongated line sensors made of one-dimensionally aligned photosensors. Photosensors using thin film transistors are mainly divided into photodiode type and photoconductive type.

In photodiode type photosensors, since a reverse bias voltage is applied across a junction between electrodes, pairs of light-induced electrons and holes are respectively driven to the corresponding electrodes. Thus, only a primary photocurrent flows without injecting carriers from the electrodes.

In contrast, with the above, a photoconductive type photosensor allows electrons or holes to be injected from an electrode so that the density of electrons or holes within a semiconductor region becomes sufficiently high to obtain considerably larger output current (secondary photocurrent) than that of a photodiode type, by applying a voltage between electrodes.

The following prior art is known and have been proposed with respect to a photoelectric converter having photoconductive type photosensors:

(1) A photosensor shown in FIG. 1 (Journal of the Institute of Image Electronics in Japan, Vol. 15, No. 1, 1986 is hereafter referred to as a Prior Art).

In the photosensor shown in FIG. 1, formed on an insulation substrate 1 such as glass or ceramics is a semiconductor layer 2 serving as a photoconductive layer such as CdS.Se or a-Si:H. There are also formed thereon a pair of main electrodes 4 and 4' on doped semiconductor layers 3 and 3' serving as ohmic contacts. In this case, the doped semiconductor layers 3 and 3' are n-type in case that carriers injected into the semiconductor layer 2 from the electrode are electrons, and p-type if carriers are holes.

With the construction as above, as light is applied to the semiconductor layer 2 from the insulation substrate 1 (provided that the insulation substrate 1 is transparent) side or from the main electrode 4, 4' side, electrons or holes contributing to conduction are light-induced within the semiconductor layer 2 between the main electrodes 4 and 4' and the density thereof becomes high.

Accordingly, as shown in the Figure, as a voltage is applied between the main electrodes 4 and 4', a light-induced large secondary current flows as a signal current to allow a large output to be developed across a load resistor (not shown).

(2) A prior art reference using a TFT device shown in FIG. 2 as a photosensor (Japanese Patent Application No. 142986/1986 is hereafter referred to as Prior Art 1).

This Prior Art 1 has been proposed by the present applicant wherein auxiliary electrodes are provided at a sensor portion to stabilize a photocurrent and improve the linearity of dependence of a photocurrent upon illumination.

FIG. 2 is an illustrative view of a basic structure showing a photoconductive type sensor and its drive element of an improved photoelectric converter already proposed by the present applicant. Similar elements to those shown in FIG. 1 are represented by using identical reference numbers.

Referring to FIG. 2, formed on a transparent or opaque insulation substrate 1 are a gate electrode 5 made of a patterned transparent or opaque conductive layer, and an insulation film 6 made of insulation material such as SiOx or SiNx by means of the sputter method or the glow discharge method. Formed on the insulation film 6 are a semiconductor layer 2 made of a-Si:H serving as a photoconductive layer as discussed before, doped semiconductor layers 3 and 3' made of a-Si:H, and main electrodes 4 and 4' (in this case, the main electrode 4 is a drain electrode and the main electrode 4' is a source electrode).

Assuming that electrons are injected carriers, the doped semiconductor layers 3 and 3' are made of n-type a-Si:H.

With the photoconductive type sensor as above, a DC source 7 is connected between the drain electrode 4 and the source electrode 4', and a variable DC source 8 is connected between the source electrode 4' and the gate electrode 5. The variable DC source 8 can also reverse the polarity.

In this example, the sensor portion operates at a gate negative potential ($V_G$). As shown in FIG. 3A, according to the space charge distribution of the Poisson formula, the energy band in case of a non-doped i-type a-Si:H layer is usually provided with a depletion area by about 1 micron. Namely, the gate side of the i-type semiconductor layer 13 is strongly inverted to p-type.

(3) A Prior art using the TFT shown in FIG. 2 as a photosensor and as a drive element therefor (EP Laid-Open Publication No. 232,083. Hereinafter referred to as Prior Art 2.

The above-described Prior Arts, however, have the following problems and some points require improvement:

(1) Prior Art

The linearity ($\gamma$:$Ip\alpha F$) of dependence of a photocurrent upon strength of light is poor (i.e., $\gamma$ becomes less than 1), wherein F represents the illumination of light incident on the region between the main electrodes 4 and 4' from the main electrodes side of the sensor shown in FIG. 1, and Ip represents a photocurrent flowing through the main electrodes 4 and 4'.

(2) Prior Art 1 has also the following points which can undergo some improvements. First, an example of the linearity ($\gamma$:$Ip\alpha F$) of dependence of a photocurrent upon light amount is shown in FIG. 4, wherein F represents the illumination of light incident to the region between the main electrodes 4 and 4' from the main electrodes side of the sensor shown in FIG. 2, and Ip represents a photocurrent flowing through the main electrodes 4 and 4'.

In FIG. 4, a curve (a) indicates a photocurrent Ip flowing through the photosensor shown in FIG. 2, and a curve (b) indicates a γ value.

As seen from FIG. 4, if the photosensor of Prior Art 1 operates at a negative potential of the gate electrode 5, the linearity of dependence of a photocurrent upon the light amount is improved but the amount of photocurrent is reduced. That feature should undergo some improvements.

It is considered that the reduction of photocurrent is caused by a low gain $G = \mu\tau E/L$ of a secondary photocurrent due to a short life of light-induced carriers (electrons in this case) on the gate side of the i-type semiconductor layer which has been strongly inverted to p-type. Symbols of the above equation are defined as:

μ: electron mobility
τ: life of electron
E: electric field
L: distance between electrodes.

To obtain photocurrent sufficient for operating the line sensor, it is necessary to make a film thickness of the semiconductor layer large, generally thicker than 0.5 micron and in some cases 1 to 2 microns. Therefore, not only the time required for forming a film becomes long, but also the contact hole for the gate electrode must be formed deeper, thus leading to potential failure of contacts and inconvenience in the manufacture.

Further, since the energy band of the semiconductor layer is almost uniformly inclined, the surface of the gap portion between the main electrodes 4 and 4' is susceptible to the influence of ions and moisture, and carriers are likely to be trapped at a deep interfacial level present at the interface between the semiconductor layer and the gate insulation film. Accordingly, the conditions of forming a passivation or an interface have been restricted.

(3) Prior Art 2 has also the following points to be improved.

According to Prior art 2 utilizing the TFT device shown in FIG. 2 as a photosensor and as its drive element, there are occasionally a plurality of traps at the vicinity of the interface between the gate insulation film 12 and the semiconductor layer 13 of the TFT device (See FIGS. 3A-3D) so that carriers are trapped gradually. Therefore, there remain several points which require improvement, notably a threshold voltage $V_{TH}$ which fluctuates, a drain current which changes in time, the TFT device is susceptible to the effects (caused by traps generated by ions or moisture) of the interface, and the stability and reproductiveness of a semiconductor layer at the vicinity of the interface are poor.

SUMMARY OF THE INVENTION

It is an object of the present invention to provide a TFT device whose threshold voltage $V_{TH}$ does not fluctuate and whose drain current does not change in time.

It is another object of the present invention to provide a TFT device whose semiconductor layer at the vicinity of an interface provides a good stability.

It is a further object of the present invention to provide a TFT device when used as a photoconductive type photosensor using a secondary photocurrent as a pickup signal, a good linearity of a light-induced photocurrent relative to the light amount incident to the sensor can be realized and a good light response can be achieved.

It is another object of the present invention to provide a TFT device which when used as a photosensor and as the drive element of a photoelectric converter, the objects as above can be attained and the photosensor and its drive element can be implemented integrally by the same process.

It is a still further object of the present invention to provide a TFT device comprising an insulation substrate, a semiconductor layer formed on the insulation substrate, a pair of opposed electrodes formed on the semiconductor layer, and a gate electrode formed on the semiconductor layer with an insulation film interposed therebetween, wherein a region doped with at least one type of impurity selected from atoms belonging to group V of the periodic table is formed in the semiconductor layer at the vicinity of the interface between the semiconductor layer and the insulation layer.

BRIEF DESCRIPTION OF THE DRAWINGS

FIG. 1 is a sectional view of a photosensor of a photoelectric converter according to Prior Art;

FIG. 2 is a sectional view of a photosensor of a photoelectric converter according to Prior arts 1 and 2;

FIGS. 3A to 3D show energy bands of semiconductor layers of photoelectric converters;

DETAILED DESCRIPTION OF THE PREFERRED EMBODIMENTS

Glass, ceramics or the like may be used as the insulation substrate of the present invention. The insulation substrate may be transparent or opaque. In case of a transparent insulation substrate, light is incident to the semiconductor layer through the transparent insulation substrate.

As a material of a semiconductor forming the semiconductor layer on the insulation substrate of the photosensor and its drive element, a-Si:H may advantageously be used. A well known semiconductor material such as CdS·Se or the like may also be used to attain similar effects.

Figure 6A:
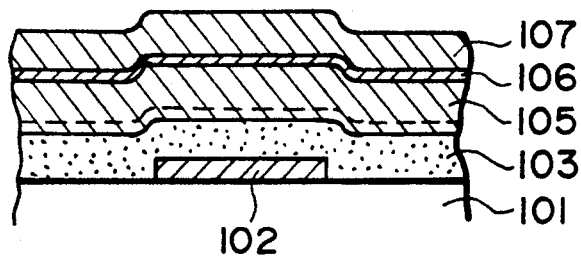
FIGS. 6A to 6D are sectional views illustrating a first embodiment of the manufacturing process of a photoelectric converter according to the present invention.
Figure 6B:
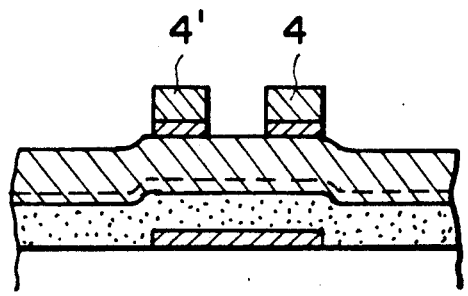
Figure 6C:
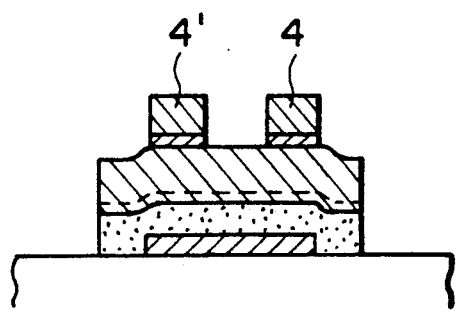
Figure 6D:
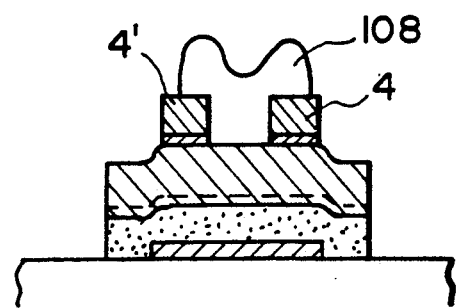

The positional relationship between a pair of opposed main electrodes and the gate electrode formed on the semiconductor layer with an insulation film interposed therebetween may be an upper gate stagger type shown in FIG. 6D, a so-called lower gate coplanar type, an upper gate coplanar type, or a lower gate stagger type.

As atoms belonging to group V of the periodic table, those atoms belonging to the V(6) group are mainly used, which are for example N, P, As, Sb and Bi.

One type of atoms may be used or two or more types of atoms may be used together.

The doping region of impurity has a depth up to 1000 angstroms from the interface between the semiconductor layer and the insulation film. The impurity density at the region is preferably 0.1 to 1000 ppm.

The impurity may be doped uniformly or may not be doped uniformly within the region. For example, the impurity may be doped such that the doped density at the interface between the semiconductor layer and the insulation film is made zero and a constant density gradient is formed in the direction of layer thickness starting from the interface.

Conversely, another doping may be possible such that the impurity density at the vicinity of the gate insulation film is set high and the density is gradually lowered at the position remote from the insulation film. With such arrangement, the energy band of the n-type semiconductor at the vicinity of the insulation film can be bent more abruptly toward the insulation film side.

Conductive metals such as Al, Cr or the like may be used as the main electrodes which may be formed by conventional means such as the sputter method.

As the means of doping impurity in an a-Si:H semiconductor layer, the glow discharge deposition method using as a main raw material $SiH_4$ gas mixed with $PH_3$, $N_2$, $NH_3$, $AsH_3$ gas or the like, or various known methods may be used.

The characteristic feature of the present invention which results from the formation of a doped region at the vicinity of the interface between the semiconductor layer and the insulation layer, may be reasoned presently as follows:

First, the photoelectric converter used as a photosensor wherein the a-Si:H semiconductor layer at the vicinity of the gate insulation film is doped to n-type, will be described with reference to the drawings.

FIG. 3 shows the state of energy bands of a semiconductor layer 13 of a sensor with a gate electrode.

Figure 3A:
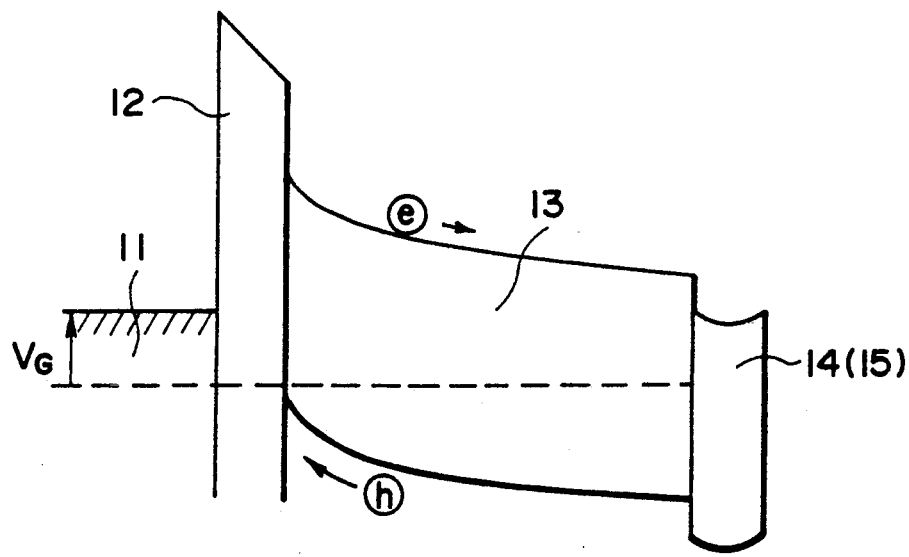

FIG. 3A shows the state of energy band of the semiconductor layer of Prior Art 1 which is an i-type a-Si:H.

Figure 3B:
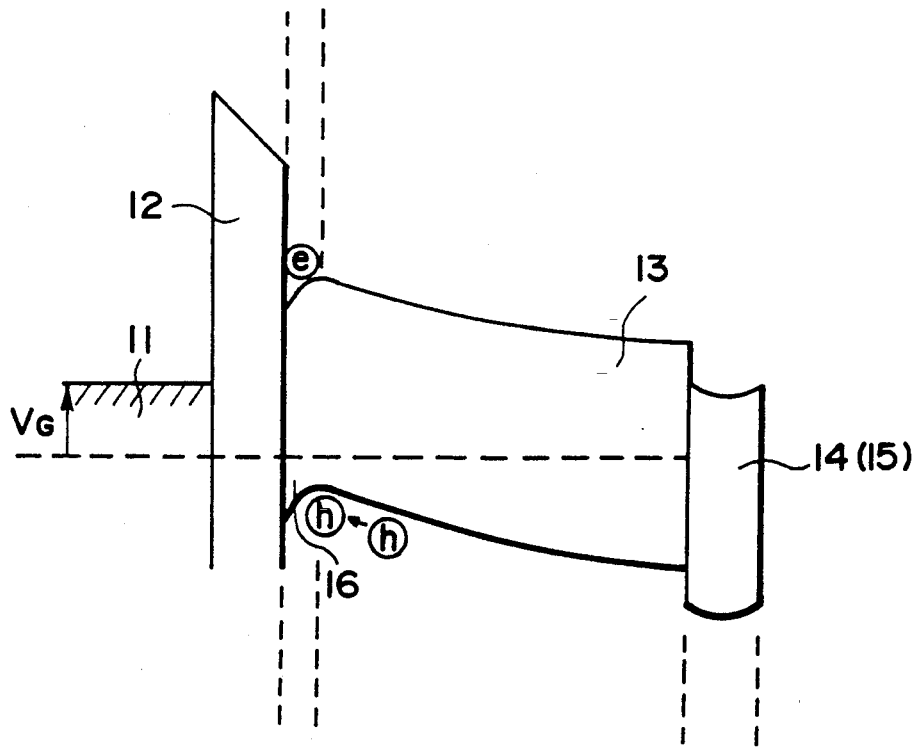

As the semiconductor layer 13 at the vicinity of the gate insulation film 12 is doped to n-type, the energy band of the semiconductor layer 13 at the vicinity of the insulation film 12 has a peak at a certain depth from the insulation film 12 and gradually lowers toward the insulation film 12, as shown in FIG. 3B. An example of the photocurrent characteristic is shown by a curve (c) in FIG. 4 wherein a TFT device having the energy band shown in FIG. 3B is used as a photosensor.

Figure 4:
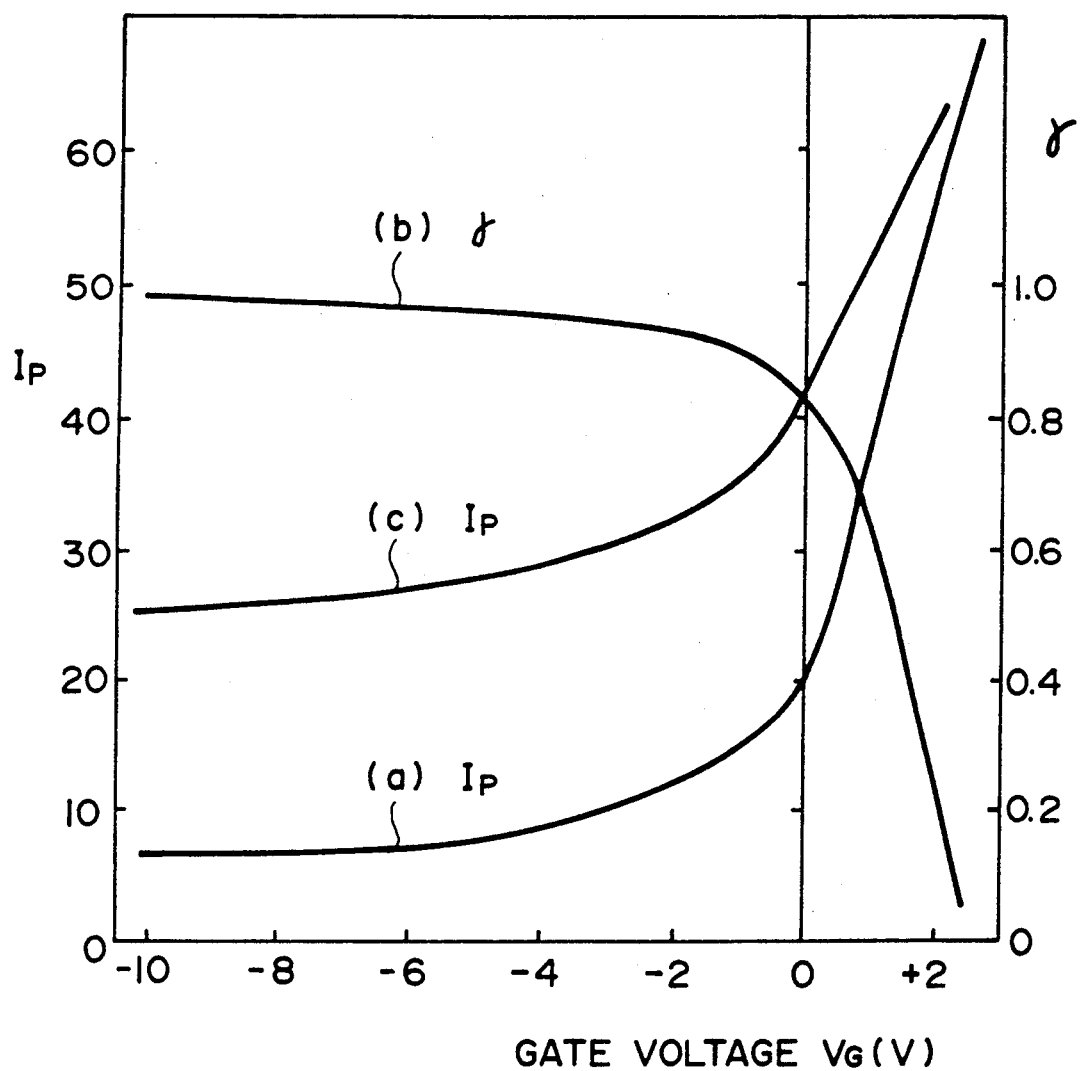
FIG. 4 is a graph showing a gate voltage relative to a photocurrent and a γ value with respect to a photoelectric converter according to the present invention and the Prior Arts.

The linearity ($\gamma$) of dependency of a photocurrent of the photosensor upon the light amount is substantially the same as the light amount dependency curve (a curve (b) of FIG. 4) obtained by the semiconductor layer without doping.

According to the present invention, an extremely thin n-type semiconductor region in the semiconductor layer serves as a current path mainly for the photocurrent (secondary photocurrent) to thereby increase the gain G of photocurrent. Accordingly, the thickness of the semiconductor layer can be advantageously thinned to the degree that a sufficient light absorption is ensured.

For instance, light absorption at an a-Si:H semiconductor becomes more than 90% at a thickness of 5000 angstroms. Therefore, with the structure of this invention, the thickness of the semiconductor layer may be thinner than 5000 angstroms.

Further, since the band profile at the vicinity of the interface between the semiconductor layer and the insulation film is made gentle, it can be considered that the gap surface between the main electrodes has become not susceptible to the influence of ions, moisture and the like.

As described later with respect to the embodiments, a change in time in a photocurrent value and a $\gamma$ value at high temperature and under high humidity is small and a change of a sensor characteristic caused by an etching method for the gap portion is small. The reason for these is attributable to the above discussion.

It is known that current flowing through the semiconductor layer of a photoconductive type sensor can be divided into primary photocurrent components and secondary photocurrent components. Generally, the secondary current components are large as compared with the primary photocurrent components. Therefore, the behavior of the photocurrent is decided by the second photocurrent components.

The amount of the secondary photocurrent components is proportional to the light-induced and re-injected electron density (=hole density) at the conduction band within the semiconductor layer during the life time of other than electrons (=hole life time). Therefore, as a negative bias is applied to the gate electrode, the electron life time is shortened to thereby reduced the photocurrent. Light-induced electrons and holes move oppositely to each other along the potential gradient within the semiconductor layer 13 as shown in FIG. 3A. As time elapses after the light is applied, holes are gradually accumulated at the vicinity of the interface between the gate insulation film 12 and the semiconductor layer 13.

Further, as the accumulation of holes progresses, the effect of electric field between the gate electrode 11 and the semiconductor layer 13 is weakened so that the width of the depletion layer is gradually narrowed to increase the photocurrent.

The set-up characteristic of a photocurrent is determined by that at what stage during the hole accumulation process light is applied to the sensor. The process is governed by the light-induced charge, particularly the motion of holes and accumulation thereof between the gate insulation film and the semiconductor layer. Therefore, in case that the incident light amount to the sensor portion of the photosensor is small, the set-up characteristic of a photoconductive type sensor changes in time and becomes far apart from a desired one.

Next, the response of a sensor after light is intercepted will be described. Although the primary photocurrent attenuates quickly after the interception of incident light, mainly holes trapped in the semiconductor layer remain without being recombined so that electron current corresponding in amount to the trapped holes continues to flow in the photosensor. Thus, in general, the set-down characteristic of photoconductive type sensor is not good.

In the specific photoconductive type sensor of Prior Art 1 shown in FIG. 3A, since a multiplicity of holes are accumulated at the vicinity of the interface between the insulation film and the semiconductor layer where a deep trap level and a high density are present, the above-described residual current continues to flow for a long time.

FIG. 3B shows the state of energy band of a TFT device of this invention. In the Figure, reference numeral 11 denotes a gate electrode, 12 a gate insulation film, 13 a semiconductor layer, 14 (15) an n-type high density impurity layer for ohmic contacts of the photosensor. Reference numeral 16 represents a n-type semiconductor region at the vicinity of the interface between the semiconductor layer 13 and the gate insulation film 12, the n-type semiconductor region 16 being lightly doped with impurity atoms belonging to the V group of the periodic table.

As seen from the energy band shown in FIG. 3B, the n-type region 16 functions as a barrier against holes so that the holes cannot move near the interface between the semiconductor layer and the gate insulation film. Even if holes are trapped at the vicinity of the interface, the holes are recombined with electrons because of a high electron density at that portion. Thus, the TFT device of this invention can improve the set-down characteristic considerably.

In the TFT device of this invention shown in FIG. 3B, the potential gradient within the i-type semiconductor layer through which a photocurrent flows is gentle because of the presence of the lightly doped layer 16. Therefore, as different from the case of Prior Art 1 shown in FIG. 3A, it can be considered that the phenomenon of accumulation of a multiplicity of holes does not occur so that the set-up characteristic is also improved.

By virtue of the above-described operation of the TFT device of this invention, both the set-up and set-down characteristics for a light pulse can be improved.

Next, the operation of the TFT device of this invention used as a drive element for a photosensor will be described.

A deep trap at the vicinity of the interface between the gate insulation film and the semiconductor layer can be practically made inactive by properly selecting a Fermi level of the semiconductor layer 16.

In this respect, first the function of the semiconductor layer doped to n-type at the vicinity of the gate insulation film will be described in detail with reference to the drawings.

FIG. 3C-A illustrates the Prior Art wherein only an a-Si:H semiconductor layer is used as the semiconductor layer 13 and the bias to the gate electrode is zero.

As shown in FIG. 3D-B wherein the semiconductor layer 13 at the vicinity of the gate insulation film 12 is changed to n-type through doping with a positive gate bias voltage being applied to the gate electrode 11, the energy band of the semiconductor layer 13 at the vicinity of the insulation film 12 has a peak at a certain depth from the insulation film 12 and lowers gradually as it comes near the insulation film 12.

In case where the TFT device of this invention is used as a drive element of a photosensor and the like, the deep trap at the vicinity of the interface can be practically made inactive by properly selecting the Fermi level of the semiconductor layer 16.

The detailed description therefor will be given below:

In a non-doped case (in case of Prior Art), as shown in FIG. 3C-A, an acceptor type trap 40 positioned near the interface between the gate insulation film 12 and the semiconductor layer 13 is at an energy level slightly higher than the Fermi level ($E_F$) when the gate electrode 11 is biased to a zero voltage ($V_G=0$).

In contrast, as shown in FIG. 3C-B, when a positive bias voltage ($V_G>0$) is applied to the gate electrode 11, the trap 40 near the interface moves lower than the Fermi level so that the trap 40 traps electrons relatively slowly and is charged negative. Thus, the drain current of the drive element reduces in time.

In an n-type region is formed at the vicinity of the gate insulation film 12 through doping (in case of the embodiment of this invention), the trap 40 is at an energy level lower than the Fermi level even when the bias voltage of zero ($V_G=0$) is applied to the gate electrode 11, as shown in FIG. 3D-A.

In contrast, as shown in FIG. 3D-B, even when a positive bias voltage ($V_G>0$) is applied to the gate electrode 11, the energy level relationship as above does not change. Therefore, even when a positive bias is applied to the gate electrode 11, the decrease in drain current in time can be suppressed to a low level.

In the Figure, a broken line of a trap level indicates the area of the energy status while electrons are being trapped.

In a non-doped case (in case of the Prior Art), when a bias applied to the gate electrde changes from 0 to a positive value (on-state of the TFT device), the electron status near the interface changes from the status where electrons are rarely trapped to the status where electrons are trapped to an acceptor level. In case of this invention, even when a bias voltage applied to the gate electrode changes to positive, or even when a bias of 0 to negative is applied to the gate electrode, electrons remain trapped at a trap level and no change occurs.

As described so far, according to a TFT device of this invention, advantageously the drive element for a photosensor can be implemented on a same substrate of the photosensor by a same process, and in addition, a change in drain current in time can be suppressed to a low level during operation of the drive element. Next, the embodiments of the present invention will be described.

First Embodiment

FIGS. 6A to 6D are sectional views showing an embodiment of the manufacturing processes for a TFT device according to the present invention.

A glass substrate 101 (#7059 manufactured by Corning Co.) whose both sides have been abraded was washed using neutral detergent.

Next, an Al thin film was deposited on the glass substrate 101 to a thickness of 0.1 micron by the spatter method. A photoresist pattern of a desired shape was formed thereon using a positive type resist (OFPR-800 manufactured by Tokyo Applied Chemistry Co.). Thereafter, the thin film Al was etched using a solution (hereinafter called Al etching solution) made of a mixture of phosphoric acid (85% aqueous solution), nitric acid (60% aqueous solution), acetic acid and water at a volume ratio of 16:1:2:1, to thereby form a gate electrode 102 serving as both a control electrode and a light shielding film.

After removing the photoresist, the glass substrate 102 formed with the gate electrode was set within a glow discharge deposition apparatus of a capacitive couple type and maintained at a temperature of 200° C. under a vacuum of $1\times10^{-6}$ Torr.

Next, 10% SiH$_4$ (H$_2$ base) (manufactured by Komatsu Electronics Co.) at 100 sccm and an NH$_3$ gas at a purity of 99.999% and at 100 sccm were introduced into the apparatus with a gas pressure being adjusted to 0.4 Torr. Thereafter, a glow discharge was conducted for 60 minutes at a radi-frequency discharge power of 100 W by using a RF power source at 13.56 MHz to form an SiN$_x$:H layer 103 having a thickness of 300 angstroms.

Succeedingly, 10% SiH$_4$ (H$_2$ base) at 300 sccm and 10 ppm PH$_3$ (H$_2$ base) at 1.5 sccm were introduced in the deposition apparatus (PH$_3$/SiH$_4$=0.5 ppm) to be subjected to a glow discharge for 15 minutes at a gas pressure of 0.3 Torr and at an RF discharge power of 150 W, thereby forming a semiconductor region 104 (500 angstroms in thickness). Then, 10 ppm PH$_3$ gas was stopped and only the 10% SiH$_4$ (H$_2$ base) was made to continue to flow at 30 sccm, to thereby form an i-type a-Si:H semiconductor layer 105 having a thickness of 4000 angstroms.

Next, 10% SiH$_4$ (H$_2$ base) at 100 sccm and 100 ppm PH$_3$ (H$_2$ base) at 450 sccm were introduced in the deposition apparatus and subjected to a glow discharge for 40 minutes at a gas pressure of 0.5 Torr and at an RF discharge power of 500 W, to thereby form an n+ type a-Si:H layer 106 (1000 angstroms in thickness) serving as an ohmic contact layer.

Next, a Cr film (500 angstroms in thickness) and an Al film (5000 angstroms in thickness) were deposited in this order on the n+ type a-Si:H layer 106 (see FIG. 6A). A photoresist pattern of a desired shape was formed thereon using a positive type photoresist. The Cr film was etched using a mixed aqueous solution (CR etching solution) and the Al film was etched using the Al etching solution, to form main electrodes 4 and 4' (FIG. 6B).

Next, using the main electrode 4 and 4' as a mask, the n+ type a-Si:H layer 106 was selectively etched using a mixed solution of hydrofluoric acid (59% aqueous solution), nitric acid (70% aqueous solution) and acetic acid at a volume ratio of 2:10:88 with iodine dissolved and supersaturated therein, and the photoresist was removed.

Next, unnecessary portions of the a-Si:H layer and the SiNx:H layer were removed after a photoresist pattern was formed, by using a reactive ion etching apparatus, to thereby isolate elements (FIG. 6C). Thereafter, a silicon resin serving as a passivation film was coated on the portion except electrode pickup portions. The phosphorus (P) density within the n-type a-Si:H semiconductor was measured by means of a SIMS which showed 5 ppm.

The TFT device manufactured by the above processes was compared with the TFT device of Prior Art 2 with respect to their performance.

Figure 5:
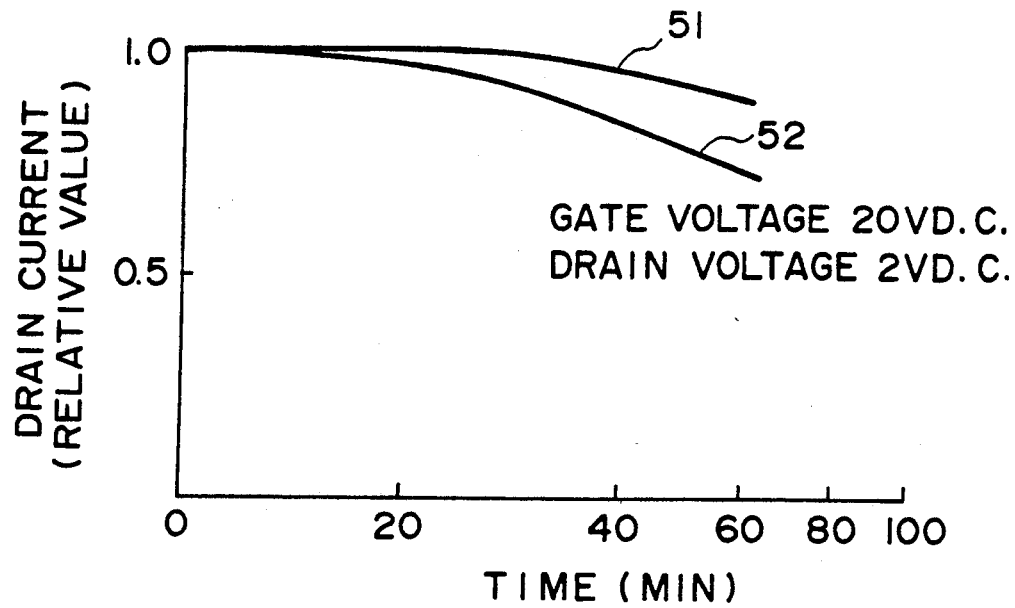
FIG. 5 is a graph showing a change in drain current in time of a TFT used in the present invention.

(a) Referring to FIG. 5, a curve 51 indicates a change in drain current in time with F doped into the semiconductor layer by 5 ppm, and a curve 52 indicates a change of drain current in time in case of a non-dope device (Prior Art).

As seen from FIG. 5, as the Fermi level of the semiconductor layer 13 comes near the conduction band, a change in drain current in time becomes small.

Next, the manufacture TFT device used as a photosensor was compared with the photosensor of Prior Art 1 with respect to their performance.

(b) Initial values of a photocurrent and a dark current are shown in Table 1.

TABLE 1

(1) Dependency of photocurrent/dark current upon an n+ region etching method

| | n+ region etching method | |
|---|---|---|
| | ion etching | reactive ion etching |
| Prior Art 1 | 5nA/0.02A | 0.8nA/0.01nA |
| Embodiment | 20nA/0.05nA | 18nA/0.01nA |

(2) Dependency of photocurrent/dark current upon an n+ region passivation method

| | passivation method | |
|---|---|---|
| | coating with silicon resin | SiN:H film by plasma CVD |
| Prior Art 1 | 5nA/0.02nA | 0.5nA/0.01nA |
| Embodiment | 20nA/0.05nA | 13nA/0.01nA |

As seen from Table 1, the photosensor manufactured in the above embodiment can increase a photocurrent with less increase in dark current.

The right column in Table 1 (1) indicates the case where the reactive ion etching method using column in Table 1 (2) indicates the case where an SiN:H film formed by the PCVD method was used for the passivation. In the present embodiment, the characteristic of the photosensor changes only slightly even if the methods of etching the n+ type a-Si:H layer and of passivation are changed.

Accordingly, it can be understood that the characteristic of the photosensor of this embodiment is not susceptible to the influence of the surface conditions (particularly ions and moisture) of the photoconductive layer.

(c) An additional passivation film was formed on the photosensor manufactured as above to conduct a durability test at high temperature and under high humidity.

Figure 7:
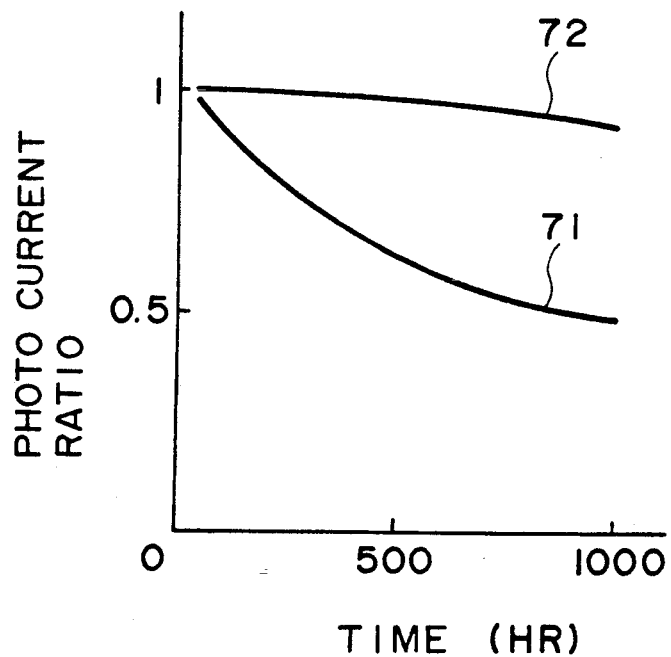
FIG. 7 is a graph showing the results of a durability test for the photoelectric converter of the first embodiment.

FIG. 7 is a graph showing the test result of a photosensor maintained at a temperature of 60° C. and a humidity 90%, wherein the abscissa represents a time and the ordinate represents a ratio of a photocurrent, the initial value thereof being assumed 1.

Although the photocurrent of the photosensor of Prior Art 1 reduced gradually in time (a curve 71 of FIG. 7), that of the embodiment changed only slightly in time (a curve 72 of FIG. 7). Thus, it is seen that the photosensor of this embodiment if not susceptible to the influence of humidity.

(d) Next, a difference of an initial light response was studied, the results of which are shown in Table 2.

TABLE 2

| | Light Response |
|---|---|
| | $\tau$ on/$\tau$ off |
| Prior Art 1 | 10 msec/12 msec |
| Embodiment | 5 msec/8 msec |

Note: Light quantity used in the measurement was 100 Lx. $\tau$ on is a time for a photocurrent to reach 90% of a saturated value, and off is a time to reach 10% of the saturated value.

As seen from Table 2, the light response of the photosensor of this embodiment improved to satisfy both a large photocurrent value and the quick light response.

(e) The photocurrent (Ip) and the $\gamma$ value are shown in FIG. 4 (wherein a curve (a) represents a dependency of Ip on the gate voltage in this embodiment, a curve (b) represents a dependency of a $\gamma$ value on the gate voltage in this embodiment and a curve (c) represents a dependency of Ip on the gate voltage in Prior Art 1).

Characteristics superior to those of Prior Art 1 were found in this embodiment.

Second Embodiment

A TFT device was manufactured in a similar manner that the n-type a-Si:H region and the i-type a-Si:H layer shown in the first embodiment were manufactured, except the introduction of the following conditions:

First, 10% $SiH_4$ ($H_2$ base) at 300 sccm and 10 ppm $PH_3$ ($H_2$ base) at 5 sccm were introduced in the deposition apparatus to start forming a film at the same pressure and power as those in the first embodiment. The 10 ppm $PH_3$ gas was gradually throttled using a flow meter and allowed to obtain flow rate of 0 sccm after 15 minutes, thereby forming an n-type a-Si:H layer of 500 angstroms in thickness.

Next, an i-typ a-Si:H layer was formed by 2 hours under the same conditions as of the first embodiment.

The similar items (a) to (e) of the first embodiment were checked for the TFT device manufactured as above. The results for all the items showed that the second embodiment was superior to Prior Art 1 similar to the first embodiment.

The P density of the n-type a-Si:H region was measured in a similar manner of the first embodiment. The result showed that the density was gradually reduced starting from about 20 ppm at the vicinity of the interface.

Third Embodiment

An N-type a-Si:H region was formed using the similar processes of the first embodiment except the use of $N_2$ as a doping gas and N as a dopant. Particularly, an n-type a-Si:H region having a thickness of 500 angstroms was formed by a discharge for 15 minutes and at a gas flow ratio $N_2/SiH_4 = 2000$ ppm wherein 10% $SiH_4$ ($H_2$ base) at 300 sccm and 100 ppm $N_2$($H_2$ base) were introduced in the deposition apparatus.

The method of forming an i-type a-Si:H layer was the same as of the first embodiment. The N doped amount in the n-type a-Si:H layer was 75 ppm according to the similar measurement method of the first embodiment.

The Ip characteristic presented the same magnitude as that of the first embodiment at a gas flow ratio ($PH_3/SiH_4 = 0.5$ ppm) and a film density (measured by a SIMS) of 5 ppm.

The similar items (a) to (e) of the first embodiment were checked for the TFT device manufactured as above. The results for all the items showed that the third embodiment was superior to Prior Art 1 similar to the first embodiment.

Since the decomposition efficiency of $N_2$ during the glow discharge is lower than that of $PH_3$ and the contribution to a change in Ip is smaller, it is advanageous in that the characteristic of a photosensor is easily and finely adjusted by controlling the impurity density.

Fourth Embodiment

A photoelectric converter was manufactured, which has on a same substrate a photosensor and its drive element respectively using TFT devices of the first embodiment.

Figure 8:
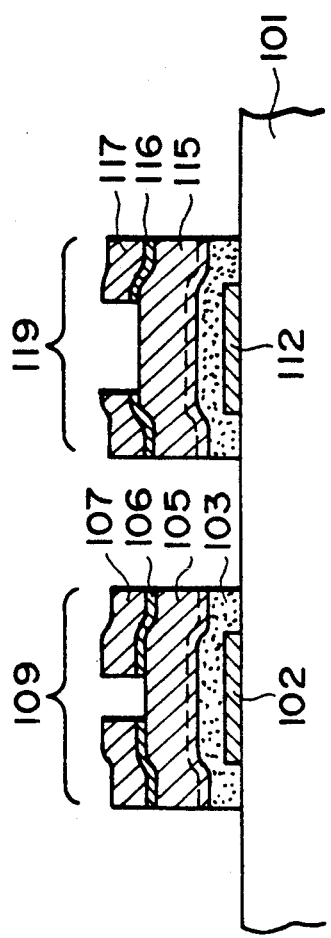
FIG. 8 is a sectional view showing a fourth embodiment of a photoelectric converter according to the present invention.

FIG. 8 is a sectional view of the photoelectric converter.

Of a photosensor 109 and its drive element 119 of the photoelectric converter, gate electrodes 102 and 112, insulation films 103 and 113, n-type semiconductor regions 104 and 114, i-type semiconductor layer 105 and 115, ohmic contact layers 106 and 116, and photosensor main electrodes 107 and source and drain electrodes 117 for the drive element all can be manufactured using same materials and same processes.

The similar items (a) to (e) of the first embodiment were checked for the photoelectric converter manufactured as above. The results for all the items showed that the fourth embodiment was superior to Prior Art 1 similar to the first embodiment.

According to this embodiment, it was found that an excellent characteristic can be obtained even a photosensor and its drive element were manufactured on a same substrate by using a same structure. Therefore, it is easy to manufacture a photoelectric converter.

In addition, there was little change in drain current of the photosensor and the drive element in time.

Further, the characteristic of a photoelectric converter showed good uniformity and reproductiveness.

Fifth Embodiment

A photoelectric converter having integrally therewith a photosensor, a capacitor and a drive element was manufactured on a same substrate with each layer being manufactured in quite the same manner as the first embodiment.

Figure 9:
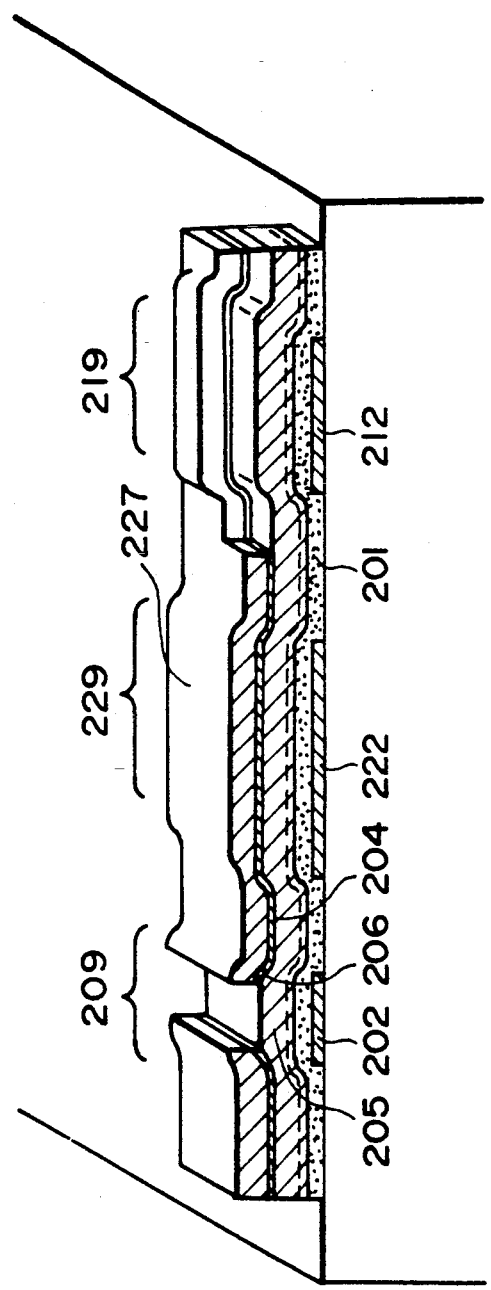
FIG. 9 is a sectional view showing a fifth embodiment of a photoelectric converter according to the present invention.

FIG. 9 is a sectional view of the photoelectric converter.

The structure and function of the photosensor and the drive element are the same as those in the first and fourth embodiments.

The capacitor of a charge storage region 229 comprises, starting from the substrate, an opposing electrode 222, an insulation film 201, an n-type a-Si:H an i-type a-Si:H layer 205, an n+-type a-Si:H region 206, and an upper electrode 227. It was confirmed that the capacitor functions normally without leaving any problem.

In this embodiment, a photocurrent induced by incident light between the main electrodes of the photosensor 209 is temporarily stored in the capacitor 229 of the charge storage region, and then transferred to an external circuit when the drive element of the charge transfer region 219 turns on.

Figure 10:
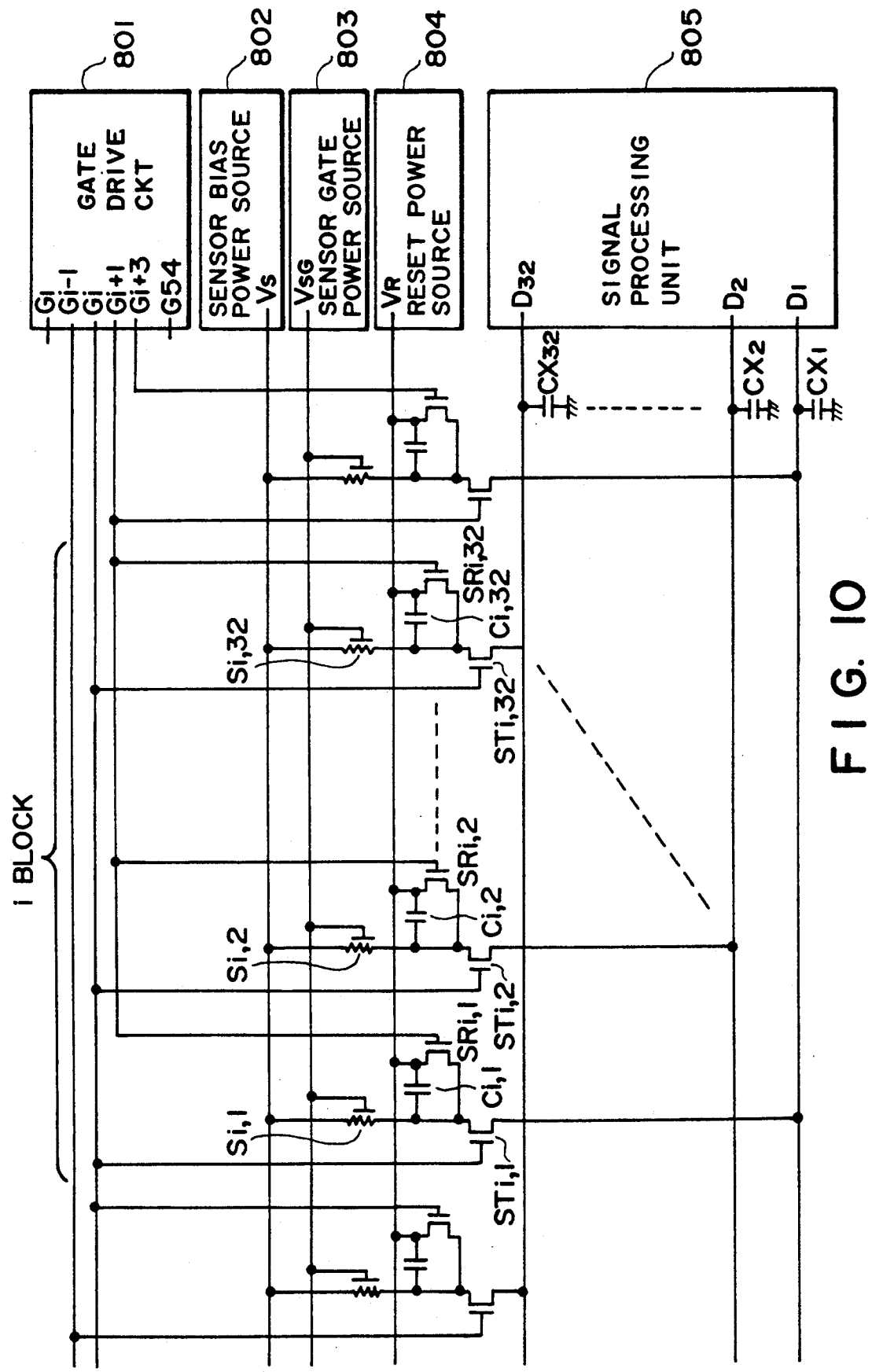
FIG. 10 is an equivalent circuit of the photoelectric converter shown in FIG. 9.

FIG. 10 is an equivalent circuit of an image reader having integrally therewith a photosensor, a capacitor and a drive element.

Referring to FIG. 10, Si,1, Si,2, . . . Si,N (hereinafter represented by Si, wherein i indicate a number and 1 to N each indicates a bit number in the block) denote photosensors in a photosensor region 209.

Ci,1, Ci,2, . . . , Ci,N (hereinafter represented by Ci) denote storage capacitors in a charge store region 229, which capacitor stores photocurrent from the photosensor Si.

STi,1, STi,2, . . . , STi,N (hereinafter represented by STi) denote transfer switches for transferring charge in the storage capacitor Ci to load capacitors CXi,1, CXi,2, . . . , CXi,N. SRi,1, SRi,2, . . . , SRi,N (hereinafter represented by SRi) denote discharge switches for resetting the charge of the storage capacitor Ci.

These photosensor region Si, storage capacitor Ci, transfer switch STi and discharge switch SRi are aligned in an array. One block is constructed of N elements and the image reader is divided into M blocks. For instance, assuming that 1728 photosensors are used, N and M may be 32 and 54, respectively.

The transfer switch STi and the discharge switch SRi disposed in an array have gate electrodes connected to a gate connection region. The gate electrode of the transfer switch STi is commonly connected within an i-th block, and the gate electrode of the discharge switch SRi is cyclically connected to the gate electrode of the transfer switch STi of the succeeding block.

A common line (gate drive line G1, G2, ..., GM) of a matrix connection region is driven by a gate drive circuit 801.

A signal output is coupled via a lead line (signal output line D1, D2, ..., D32) in matrix configuration to a signal processing unit 805 (for each block).

The gate electrode of a photosensor S1,1, S1,2, ..., S1,N, S2,1, S2,2, ..., SM,N is connected to a drive source 803 and supplied with a negative bias.

With the above arrangement, the gate drive line G1, G2, ..., G54 is sequentially supplied with a select pulse (VG1, VG2, VG3, ..., VGM) from the gate drive circuit 801.

When the gate drive line G1 is selected, the transfer switches ST1 become on-state so that the charges stored in the storage capacitors C1 are transferred to the load capacitors CX1 to CX32.

Next, when the gate drive line G2 is selected, the transfer switches ST2 become on-state so that the charges stored in the storage capacitors C2 are transferred to the load capacitors CX1 to CX32. At the same time, the charges in the storage capacitors C1 are reset by the discharge switches C1.

Similarly, thereafter selection and readout operations are conducted for the gate drive lines G3, G4, ..., GM.

The above operations are performed for each block. Signal outputs VX1, VX2, ..., VXM from the respective blocks are sent to input D1, D2, ..., DN of the signal processing unit 805 whereat they are converted into serial signals which are then outputted.

The similar items (a) to (e) of the first embodiment were checked for the photoelectric converter manufactured as above. The results for all the items showed that the fifth embodiment was superior to Prior Art 1 similar to the first embodiment.

According to this embodiment, it was found that an excellent characteristic can be obtained even a photosensor, a capacitor and its drive element were manufactured on a same substrate by using a same structure. Therefore, it is easy to manufacture a photoelectric converter.

In addition, there was little change in drain current of the photosensor and the drive element in time.

Further, the characteristic of a photoelectric converter showed good uniformity and reproductiveness.

An image on fine quality was obtained by reading image signals of the photoelectric converter of this embodiment.

Sixth Embodiment

Figure 11:
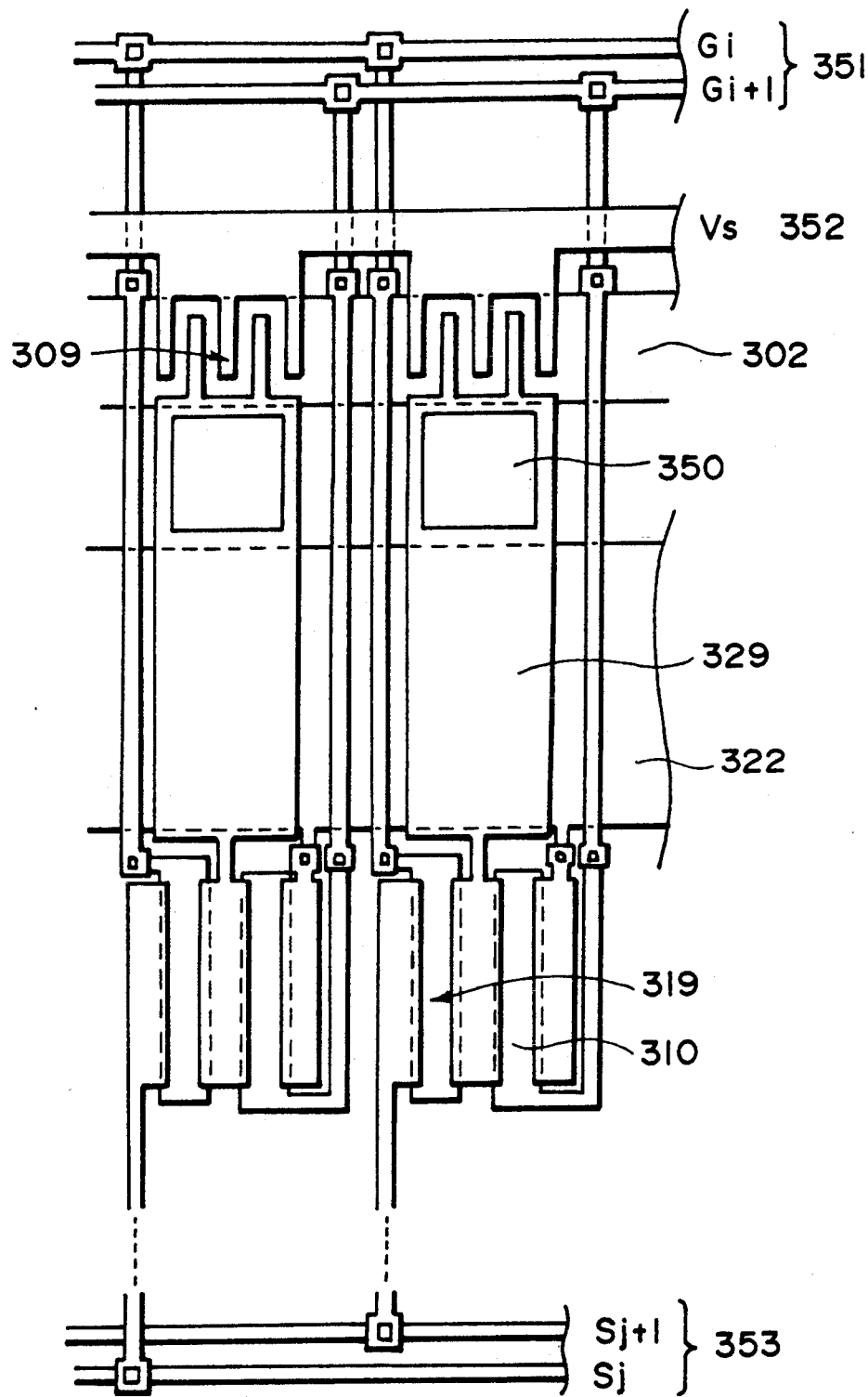
FIG. 11 is a plan view showing a sixth embodiment of a photoelectric converter according to the present invention.

FIG. 11 is a partial plan view of a so-called lens-less photoelectric converter having integrally therewith a photosensor, a capacitor and a drive element on a same substrate, wherein light is applied to the bottom of the substrate and a reflected light from an original is detected.

Figure 12:
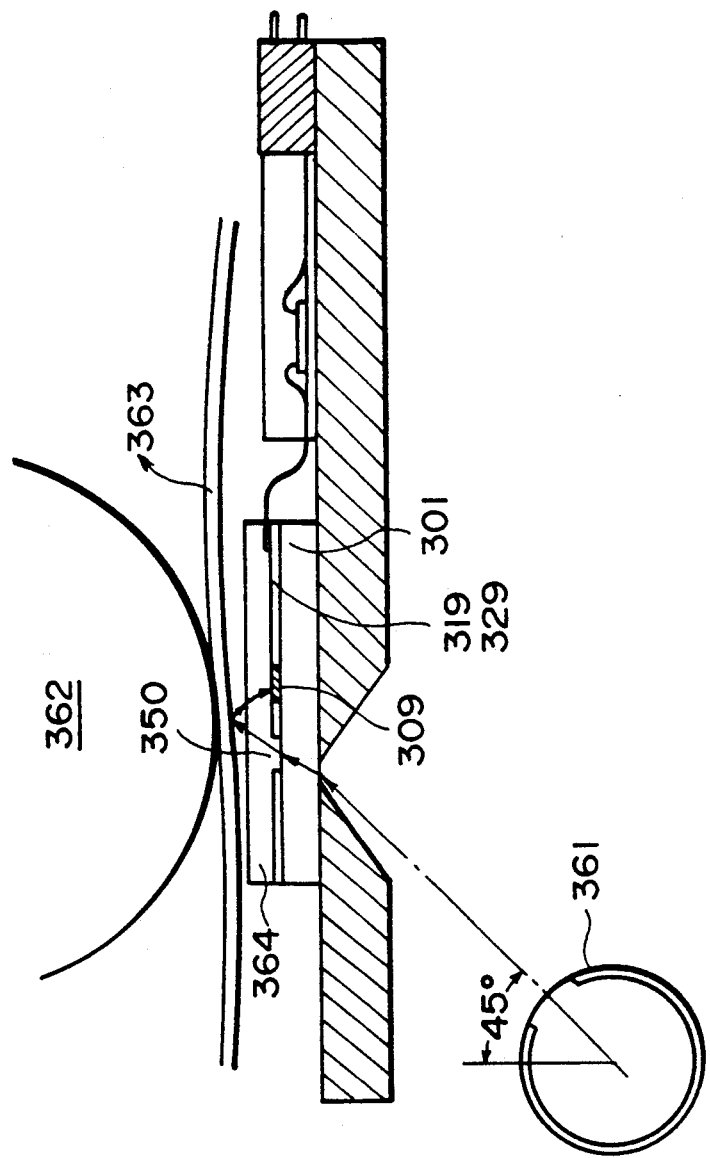
FIG. 12 is a sectional side view of the photoelectric converter shown in FIG. 11.

FIG. 12 is a sectional view of a lens-less photoelectric converter unit.

Incident light from a light source 361 passes through an input window 350 to thereby radiate light onto the surface of an original 363. A reflected light from the original 363 passes through a passivation layer 364 and applied to a sensor region 309.

The drive principle of this embodiment is quite the same as the fifth embodiment. Reference numeral 309 represents a sensor region using a TFT device of this invention, 302 a sensor gate line 319 a transfer TFT, 310 a reset TFT, 350 an input window through which light from the light source passes, 351 a gate interconnection of TFTs, 352 a sensor bias line, 329 a capacitor for storing photocurrent from a photosensor, 353 a path for a signal to be sent to a reader unit, 365 a frame for fixing a sensor substrate 301, 361 a light source, 363 an original, 362 a platen roller for holding down an original, and 364 a passivation layer for protecting the photosensor region.

The similar items (a) to (e) of the first embodiment were checked for the photoelectric converter manufactured as above. The results for all the items showed that the fifth embodiment was superior to Prior Art 1 similar to the sixth embodiment.

According to this embodiment, it was found that an excellent characteristic can be obtained even a photosensor, a capacitor and its drive element were manufactured on a same substrate by using a same structure. Therefore, it is easy to manufacture a photoelectric converter.

In addition, there was little change in drain current of the photosensor and the drive element in time.

Further, the characteristic of a photoelectric converter showed good uniformity and reproductiveness.

An image of fine quality was obtained by reading image signals of the photoelectric converter of this embodiment, and it was found that an excellent characteristic of a lens-less photoelectric converter can be obtained by applying the present invention thereto.

As seen from the foregoing detailed description, the TFT device according to the present invention has the following advantageous effects:

(1) A change in threshold voltage $V_{TH}$ in time is small so that a change in drain current in time does not occur.

(2) It is easy to control the Fermi level of a semiconductor layer to thereby enable a control of $V_{TH}$ so that the uniformity and reproductiveness of the characteristic of a photoelectric converter can be improved.

(3) The influence of the conditions of passivation material and surface process upon the characteristic is reduced.

In case that the TFT device of this invention is used with a photoelectric converter having a photosensor or a photosensor and its drive element, the following effects in addition to the above-noted effects can be obtained:

(1) The linearity of dependence of a photocurrent upon light quantity is good.

(2) A photocurrent can be increased with little increase in a dark current.

(3) Various characteristics are hardly affected by the environment conditions such as temperature and humidity.

(4) Both a large photocurrent and a good light response can be achieved.

(5) A semiconductor layer is not necessary to be made thicker to obtain a large photocurrent so that the semiconductor layer can be made thinner. Accordingly, a film is formed in short time, the depth of a contact hole for a gate is made smaller to result in less occurrence of contact failure, thus improving a manufacturing yield.

We claim:

1. A photoelectric converter responsive to a light source comprising:
   (i) a photosensor providing enhanced photocurrent and light response having:
      (a) a semiconductor layer no greater than about 5000Å in thickness containing amorphous silicon, said semiconductor layer forming electrons and holes upon interception of incident light containing optical information;
      (b) a pair of opposed main electrodes in electrical contact with said semiconductor layer;
      (c) a gate electrode;
      (d) an insulation film transparent to said incident light interposed between said semiconductor layer and said gate electrode; wherein said semiconductor layer having a region comprising silicon and at least one type of impurity selected from atoms belonging to Group V of the periodic table formed in said semiconductor layer at the vicinity of a first interface between said semiconductor layer and said insulation film; said first interface subject to accumulation of said holes upon said interception of said incident light; said region having a depth up to 1000 Å as measured from said interface and wherein from 0.1 to 1000 ppm of said impurity being present in said region; said region serving as (1) a barrier preventing said holes from moving said first interface in order to increase photocurrent gain and (2) storing said holes at a potential well at a second interface between said region and said semiconductor layer to enhance light response; and
   (ii) means for maintaining said gate electrode at an electrical potential lower than said main electrodes at least during a period in which an image signal, which corresponds to said optical information which has been subjected to photoelectric conversion, is read.

2. A photoelectric converter according to claim 1 and further comprising an insulating substrate formed with a window transparent to incident light.

3. A photoelectric converter according to any one of claims 1 or 2, wherein said impurity is P.

4. A photoelectric converter according to any one of claims 1 or 2, wherein said impurity is N.

5. A photoelectric converter according to any one of claims 1 or 2, wherein the density of said impurity is not uniform in the layer thickness direction.

6. A photoelectric converter responsive to a light source comprising:
   (i) a photosensor providing enhanced photocurrent and light response having:
      (a) a first semiconductor layer no greater than about 5000 Å in thickness containing amorphous silicon, said semiconductor layer forming electrons and holes upon interception of incident light containing optical information;
      (b) a pair of opposed main electrodes in electrical contact with said first semiconductor layer;
      (c) a first gate electrode;
      (d) a first insulation film transparent to said incident light interposed between said first semiconductor layer and said first gate electrode; wherein said first semiconductor layer having a first region comprising silicon and at least one type of impurity selected from atoms belonging to Group V of the periodic table formed in said first semiconductor layer at the vicinity of a first interface between said first semiconductor layer and said first insulation film; said first interface subject to accumulation of said holes upon said interception of said incident light; said first region having a depth up to 1000 Å as measured from said interface and wherein from 0.1 to 1000 ppm of said impurity being present in said first region; said first region serving as (1) a barrier preventing said holes from moving to said first interface in order to increase photocurrent gain and (2) storing said holes at a potential well at a second interface between said first region and said first semiconductor layer to enhance light response;
   (ii) means for maintaining said first gate electrode at an electrical potential lower than that of said main electrodes at least during a period of which an image signal which corresponds to optical information which has been subjected to photoelectric conversion, is read;
   (iii) a drive element having a second semiconductor layer containing amorphous silicon, a pair of opposed main electrodes in contact with said second semiconductor layer, a second gate electrode, a second insulation film interposed between said second semiconductor layer and said second gate electrode, said second semiconductor layer having a second region comprising silicon and at least one type of impurity selected from atoms belonging to Group V of the periodic table formed in said second semiconductor layer at the vicinity of an interface between said second semiconductor layer and said second insulation film; said second semiconductor layer being no greater than about 5000 Å in thickness and containing amorphous silicon, said second semiconductor layer forming electrons and holes upon interception of incident light containing optical information; said second insulation film transparent to said incident light; wherein said second semiconductor layer having a second region comprising silicon and at least one type of impurity selected from atoms belonging to Group V of the periodic table formed in said second semiconductor layer at the vicinity of a first interface between said second semiconductor layer and said second insulation film; said first interface subject to accumulation of said holes upon said interception of said incident light; said second region having a depth up to 1000 Å as measured from said interface and from 0.1 to 1000 ppm of said impurity being present in said second region; said second region serving as (1) a barrier preventing said holes from moving to said first interface in order to increase photocurrent gain and (2) storing said holes at a potential well at a second interface between said second region and said second semiconductor layer to enhance light response; wherein said drive element is electrically connected to said photosensor;
   a second gate drive means for applying a voltage to the second gate electrode of said drive element, wherein the image signal is read by applying positive voltage to said second gate electrode.

7. A photoelectric converter according to claim 6 and further including storage means, and wherein said photosensor, said drive element, and said storage means are integrally formed on a common insulating substrate.

8. A photoelectric converter according to claim 7, wherein a plurality of said photosensors, said storage means, and said drive elements are divided into groups electrically isolated, and said gate drive means reads signal generated by each of said groups serially.

9. A photoelectric converter according to claim 8, further comprising a second storage means for storing a signal read by said gate drive means from each of said groups serially.

10. A photoelectric converter according to claim 9, further comprising a signal processing means for serially outputting signals stored in said second storage means.

11. A photoelectric converter according to claim 8, further comprising a discharge switch for discharging said first storage means after reading the signal of one group by said gate drive means.

12. A photoelectric converter according to claim 6, wherein the gate electrode of said photosensor is biased at a negative voltage.

13. A photoelectric converter according to claim 6 and further including an insulating substrate formed with a window transparent to incident light.

14. A photoelectric converter according to claim 6, wherein said impurity is phosphorus.

15. A photoelectric converter according to claim 6, wherein said impurity is nitrogen.

16. A photoelectric converter according to claim 6, wherein the density of said impurity is non-uniform in the direction of layer thickness.

17. A photoelectric converter responsive to a light source providing enhanced photocurrent and light response comprising:
(i) a semiconductor later no greater than about 5000 Å in thickness containing amorphous silicon, said semiconductor layer forming electrons and holes upon interception of incident light containing optical information;
(b) a pair of opposed main electrodes in electrical contact with said semiconductor layer;
(c) a gate electrode;
(d) an insulation film transparent to said incident light interposed between said semiconductor layer and said gate electrode; wherein said semiconductor layer having a region comprising silicon and at least one type of impurity selected from atoms belonging to Group V of the periodic table formed in said semiconductor layer at the vicinity of a first interface between said semiconductor layer and said insulation film; said first interface subject to accumulation of said holes upon said interception of said incident light; said region having a depth up to 1000 Å as measured from said interface and wherein from 0.1 to 1000 ppm of said impurity being present in said region, said impurity being distributed so that the impurity concentration gradually increases from said first interface in the direction of layer thickness; said region serving as (1) a barrier preventing said holes from moving to said first interface in order to increase photocurrent gain and (2) storing said holes at a potential well at a second interface between said region and said semiconductor layer to enhance light response; and
(ii) means for maintaining said gate electrode at an electrical potential lower than said main electrodes at least during a period in which an image signal, which corresponds to said optical information which has been subjected to photoelectric conversion, is read.

18. A photoelectric converter responsive to a light source providing enhanced photocurrent and light response comprising:
(i) a semiconductor layer no greater than about 5000 Å in thickness containing amorphous silicon, said semiconductor layer forming electrons and holes upon interception of incident light containing optical information;
(b) a pair of opposed main electrodes in electrical contact with said semiconductor layer;
(c) a gate electrode;
(d) an insulation film transparent to said incident light interposed between said semiconductor layer and said gate electrode; wherein said semiconductor layer having a region comprising silicon and at least one type of impurity selected from atoms belonging to Group V of the periodic table formed in said semiconductor layer at the vicinity of a first interface between said semiconductor layer and said insulation film; said first interface subject to accumulation of said holes upon said interception of said incident light; said region having a depth up to 1000 Å as measured from said interface and wherein from 0.1 to 1000 ppm of said impurity being present in said region; said impurity being distributed so that the impurity concentration decreases from said first interface in the direction of layer thickness; said region serving as (1) a barrier preventing said holes from moving to said first interface in order to increase photocurrent gain and (2) storing said holes at a potential well at a second interface between said region and said semiconductor layer to enhance light response; and means for maintaining said gate electrode at an electrical potential lower than said main electrodes at least during a period in which an image signal, which corresponds to optical information which has been subjected to photoelectric conversion, is read.

19. A photoelectric converter responsive to a light source having enhanced photocurrent and light response comprising:
(a) a photosensor unit comprising a first semiconductor layer have a photoelectric conversion region; a first pair of main electrodes; and a first gate electrode provided on said photoelectric conversion region by means of a first insulating layer;
(b) a capacitor unit for storing electric signals corresponding to optical information to be subjected to photoelectric conversion at said photosensor unit having a second semiconductor layer; a second insulating layer; a second pair of electrodes provided on said second semiconductor layer by means of a second insulating layer; and
(c) a transistor unit for reading the electric signals stored in said capacitor unit having a third semiconductor layer, a third pair of main electrodes, and a third gate electrode provided on said third semiconductor layer by means of a third insulating layer;
wherein said first, second and third semiconductor layers of said photosensor unit, said capacitor unit and said transistor unit are continuously formed, each of said continuously formed first, second and third semiconductor layers have at least one region including Group V atoms at an interface to each said first, second and third insulating layers of each said photosensor unit, capacitor unit, and transistor unit; each said semiconductor layer no greater than about 5000 Å in thickness containing amorphous silicon, each said semiconductor layer forming electrons and holes upon interception of incident light containing optical information; each said insulating layer transparent to said incident light wherein each said semiconductor layer having said region comprising silicon and at least one type of impurity selected from atoms belonging to Group V of the periodic table formed in each said semiconductor layer at the vicinity of a first interface between each said semiconductor layer and each said insulating layer; said first interface subject to accumulation of said holes upon said interception of said incident light; each said region having a depth up to 1000 Å as measured from said interface and wherein from 0.1 to 1000 ppm of said impurity being present in each said region; each said region serving as (1) a barrier preventing said holes from moving to each said first interface in order to increase photocurrent gain and (2) storing said holes at a potential well at a second interface between each said region and each said semiconductor layer to enhance light response; and (d) means for maintaining said first gate electrode at an electrical potential lower than each said pair of main electrodes at least during a period in which an image signal, which corresponds to optical information which has been subjected to photoelectric conversion, is read.

* * * * *

UNITED STATES PATENT AND TRADEMARK OFFICE
CERTIFICATE OF CORRECTION

PATENT NO. : 5,308,996
DATED : May 3, 1994
INVENTOR(S) : SATOSHI ITABASHI, ET AL.

It is certified that error appears in the above-identified patent and that said Letters Patent is hereby corrected as shown below:

COLUMN 1

Line 34, "contrast," should read --contrast--.
Line 42, "have" should read --has--.

COLUMN 2

Line 47, "No. 232,083. Hereinafter" should read
--No. 232,083, hereinafter--.
Line 48, "2." should read --2).--.

COLUMN 3

Line 39, "art" should read --Art--.

COLUMN 4

Line 24, "arts" should read --Arts--.

COLUMN 5

Line 6, "V(6) group" should read --Group V(b)--.
Line 8, "atoms" should read --atom--.

COLUMN 6

Line 34, "reduced" should read --reduce--.
Line 48, "that" should be deleted.

COLUMN 7

Line 14, "the V" should be deleted.
Line 15, "group" should read --group V--.

UNITED STATES PATENT AND TRADEMARK OFFICE
CERTIFICATE OF CORRECTION

PATENT NO. : 5,308,996
DATED : May 3, 1994
INVENTOR(S) : SATOSHI ITABASHI, ET AL.

It is certified that error appears in the above-identified patent and that said Letters Patent is hereby corrected as shown below:

COLUMN 8

Line 26, "electrde" should read --electrode--.

COLUMN 9

Line 6, "radi-frequency" should read --radio frequency--.
Line 36, "electrode" should read --electrodes--.
Line 57, "F doped" should read --P doped--.
Line 59, "non-dope" should read --non-doped--.
Line 64, "manufacture" should read --manufactured--.

COLUMN 10

Line 21, "using column in" should read --was used and--.
Line 63, "(e) should read --¶ (e)--.

COLUMN 11

Line 17, "i-typ" should read --i-type-- and "by" should read --for--.
Line 68, "layer" should read --layers--.

COLUMN 12

Line 48, "indicate" should read --indicates--.
Line 61, "These" should read --This--.

COLUMN 13

Line 28, "switches C1." should read --switches SRi.--.
Line 42, "even" should read --even when--.

UNITED STATES PATENT AND TRADEMARK OFFICE
CERTIFICATE OF CORRECTION

PATENT NO. : 5,308,996

DATED : May 3, 1994

INVENTOR(S) : SATOSHI ITABASHI, ET AL.

It is certified that error appears in the above-identified patent and that said Letters Patent is hereby corrected as shown below:

COLUMN 13

Line 56, "lens-less" should read --lensless--.
Line 62, "lens-less" should read --lensless--.

COLUMN 14

Line 32, "lens-less" should read --lensless--.
Line 37, "threshould" should read --threshold--.

COLUMN 15

Line 28, "said" (second occurrence) should read --to said--.

COLUMN 16

Line 58, "photosensor;" should read --photosensor; and--.
Line 64, "and" should be deleted.

COLUMN 17

Line 3, "signal" should read --signals--.
Line 32, "(i) a" should read --(i)(a) a-- and
 "later" should read --layer--.

COLUMN 18

Line 4, "(i) a" should read --(i)(a) a--.

UNITED STATES PATENT AND TRADEMARK OFFICE
CERTIFICATE OF CORRECTION

PATENT NO. : 5,308,996
DATED : May 3, 1994
INVENTOR(S) : SATOSHI ITABASHI, ET AL.

It is certified that error appears in the above-identified patent and that said Letters Patent is hereby corrected as shown below:

COLUMN 18

Line 45, "have" should read --having--.

Signed and Sealed this

Seventeenth Day of January, 1995

BRUCE LEHMAN

*Attest:*

*Attesting Officer*    *Commissioner of Patents and Trademarks*